United States Patent
Chiu et al.

(10) Patent No.: US 10,276,506 B2
(45) Date of Patent: Apr. 30, 2019

(54) INTEGRATED FAN-OUT PACKAGE

(71) Applicant: Taiwan Semiconductor Manufacturing Co., Ltd., Hsinchu (TW)

(72) Inventors: Ming-Yen Chiu, Hsinchu County (TW); Ching-Fu Chang, Taipei (TW); Hsin-Chieh Huang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 9 days.

(21) Appl. No.: 15/215,594

(22) Filed: Jul. 21, 2016

(65) Prior Publication Data

US 2018/0025986 A1   Jan. 25, 2018

(51) Int. Cl.
| | |
|---|---|
| *H01L 23/538* | (2006.01) |
| *H01L 49/02* | (2006.01) |
| *H01L 23/66* | (2006.01) |
| *H01L 23/31* | (2006.01) |

(52) U.S. Cl.
CPC ...... *H01L 23/5389* (2013.01); *H01L 23/3114* (2013.01); *H01L 23/5384* (2013.01); *H01L 23/5386* (2013.01); *H01L 23/66* (2013.01); *H01L 28/10* (2013.01); *H01L 2223/6677* (2013.01); *H01L 2224/04105* (2013.01); *H01L 2224/12105* (2013.01); *H01L 2224/18* (2013.01); *H01L 2224/97* (2013.01)

(58) Field of Classification Search
CPC ............. H01L 2223/6677; H01L 23/66; H01L 2924/1421; H01L 2224/94; H01L 21/563; H01L 21/76843; H01L 2224/0235; H01L 2224/02379; H01L 25/50; H01L 23/485; H01L 23/45; H01L 23/5386; H01L 23/5389; G06K 19/07775
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |

(Continued)

*Primary Examiner* — Frederick B Hargrove
(74) *Attorney, Agent, or Firm* — JCIPRNET

(57) ABSTRACT

A semiconductor device including an integrated circuit, a protection layer, and a conductive via is provided. The integrated circuit includes at least one conductive pad. The protection layer covers the integrated circuit. The protection layer includes a contact opening, and the conductive pad is exposed by the contact opening of the protection layer. The conductive via is embedded in the contact opening of the protection layer, and the conductive via is electrically connected to the conductive pad through the contact opening. A method of fabricating the above-mentioned semiconductor device and an integrated fan-out package including the above-mentioned semiconductor device are also provided.

20 Claims, 26 Drawing Sheets

(56) References Cited

U.S. PATENT DOCUMENTS

| | | | |
|---|---|---|---|
| 2009/0102002 A1* | 4/2009 | Chia | H01L 27/14618 257/433 |
| 2009/0309212 A1* | 12/2009 | Shim | H01L 21/568 257/700 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0207274 A1* | 8/2013 | Liu | H01L 23/66 257/774 |
| 2013/0264684 A1 | 10/2013 | Yu et al. | |
| 2013/0307140 A1 | 11/2013 | Huang et al. | |
| 2014/0035154 A1* | 2/2014 | Geitner | H01L 23/66 257/774 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0069623 A1* | 3/2015 | Tsai | H01L 21/563 257/774 |

\* cited by examiner

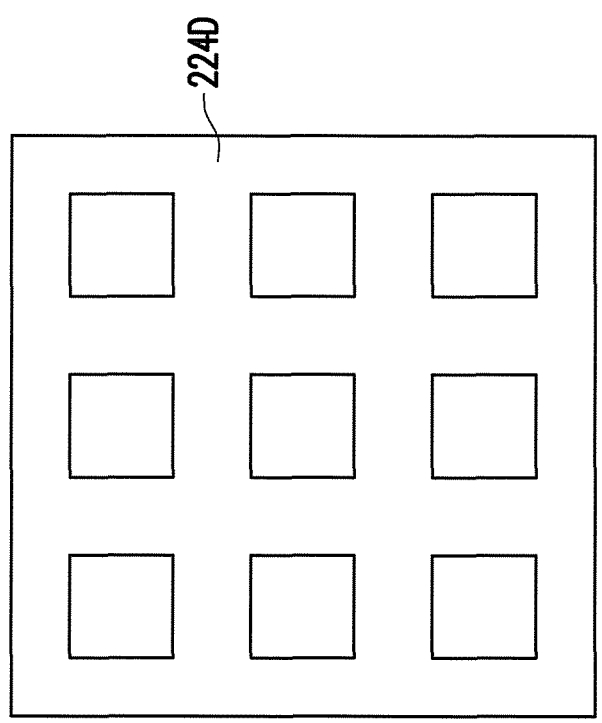

US 10,276,506 B2

INTEGRATED FAN-OUT PACKAGE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

The signal performance (i.e. Q-factor) and reliability of the radio frequency integrated circuits (RF-ICs) are relevant to the package design thereof. How to ensure the signal performance and reliability of the RF-IC packages is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 26 is a top views illustrating the dummy patterns in accordance with some alternative embodiments of the present disclosure.

DETAILED DESCRIPTION

Figure 1:
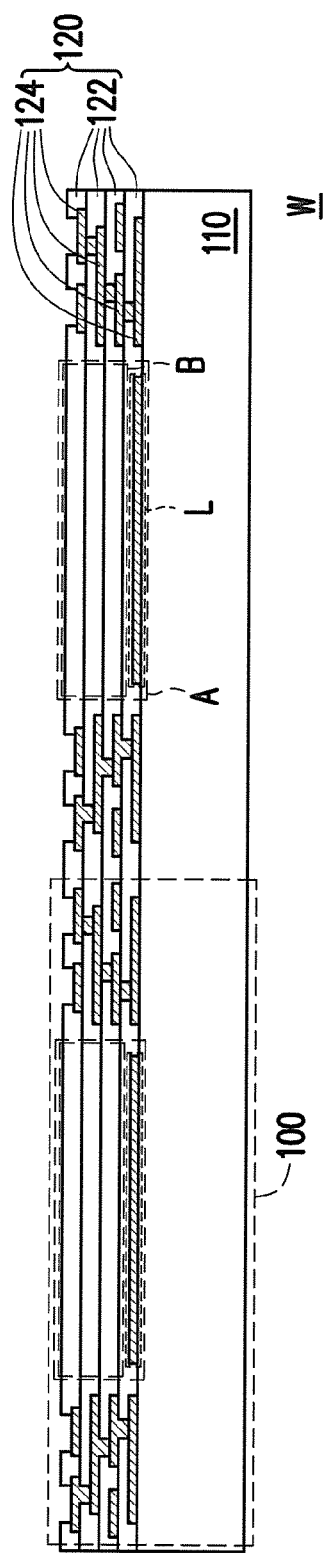
FIGS. 1 through 11 schematically illustrate a process flow for fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 11 schematically illustrate a process flow for fabricating an integrated fan-out package in accordance with some embodiments of the present disclosure.

Referring to FIG. 1, a wafer W including a plurality of integrated circuits 100 arranged in an array is provided. Before a wafer dicing process is performed on the wafer W, the integrated circuits 100 of the wafer W are connected one another, as shown in FIG. 1. In some embodiments, each of the integrated circuits 100 includes a semiconductor substrate 110 and an interconnection structure 120 disposed on the semiconductor substrate 110. The semiconductor substrate 110 may be a silicon substrate including active components (e.g., transistors or the like) and passive components (e.g., resistors, capacitors, inductors or the like) formed therein. The interconnection structure 120 may include a plurality of inter-dielectric layers 122 and a plurality of conductive layers 124 stacked alternately. For example, the inter-dielectric layers 122 may be silicon oxide layers, silicon nitride layers, silicon oxy-nitride layers, or dielectric layers formed by other suitable dielectric materials; and the conductive layers 124 may be patterned copper layers or other suitable patterned metal layers.

In some embodiments, each of the integrated circuits 100 may be a radio frequency integrated circuit (RF-IC) having at least one antenna region A. As shown in FIG. 1, the interconnection structure 120 of each integrated circuit 100 includes an inductor L (e.g., antenna wirings) embedded therein and a wiring-free dielectric portion B, the inductor L is covered by the wiring-free dielectric portion B of the interconnection structure 120, and the antenna region A is corresponding to a pre-determined area where the inductor L (e.g., antenna wirings) is located. It is noted that there is no conductive layer distributed within the wiring-free dielectric portion B, and the conductive layers 124 are distributed outside the wiring-free dielectric portion B.

As shown in FIG. 1, the antenna region A of the integrated circuit 100 includes the wiring-free dielectric portion B and the inductor L underneath, and the wiring-free dielectric portion B ensures the signal performance of the inductor L in the radio frequency integrated circuits (RF-ICs) 100.

Figure 2:
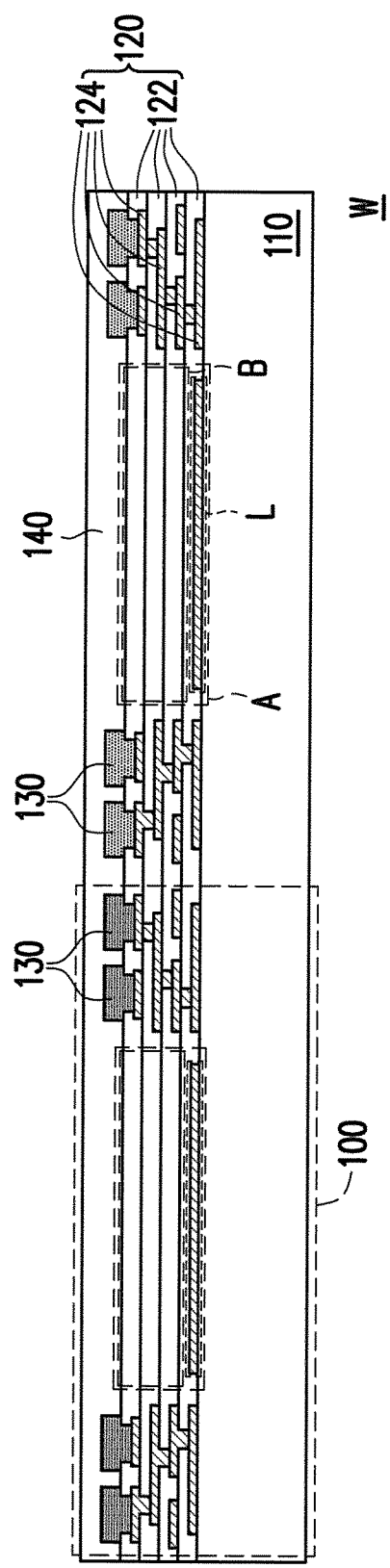

Referring to FIG. 2, a plurality of conductive pillars or conductive vias 130 are formed on the wafer W, the conductive pillars or conductive vias 130 may be formed by plating process. In some embodiments, a seed layer (e.g., Ti/Cu seed layer) may be sputtered on the wafer W first, and then a patterned photoresist is formed on the seed layer. The wafer having the seed layer and the patterned photoresist is immersed into a plating bath such that the conductive pillars or conductive vias 130 are plated onto part area of the seed layer that is exposed by the patterned photoresist. After the conductive pillars or conductive vias 130 is plated onto the exposed seed layer, the patterned photoresist is removed. Thereafter, the seed layer is patterned by using the conductive pillars or conductive vias 130 as a hard mask. In some embodiments, the conductive pillars or conductive vias 130 may be copper pillars or other suitable metallic pillars.

In some embodiments, a plurality of conductive pads (not shown in FIG. 2) for chip probing process may be optionally formed before the formation of the conductive pillars or conductive vias 130. For example, the conductive pads for chip probing process are aluminum pads or other suitable metallic pads.

As shown in FIG. 2, after the conductive pillars or conductive vias 130 are formed, a protection layer 140 is formed on the wafer W to encapsulate the conductive pillars or conductive vias 130. The conductive pillars or conductive vias 130 are not revealed and are protected by the protection layer 140. The protection layer 140 may be a polyimide (PI) layer, a polybenzoxazole (PBO) layer, or other suitable polymer (or organic) layer.

After the protection layer 140 is formed, a back side grinding process of the wafer W may be optionally performed such that the wafer W is thinned to have a reduced thickness. During the back side grinding process of the wafer W, the conductive pillars or conductive vias 130 are protected by the protection layer 140a from damage.

Figure 3:
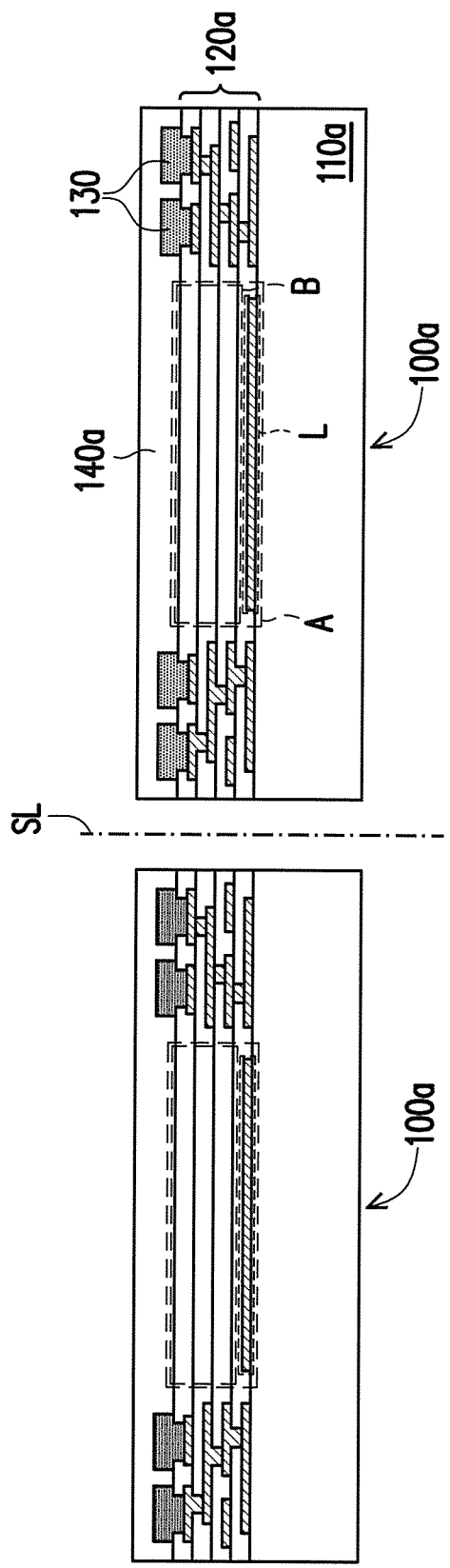

Referring to FIG. 3, a wafer dicing process or a wafer singulation process is performed along the scribe line SL such that the wafer W is singulated into a plurality of integrated circuits 100a. Each one of the singulated integrated circuits 100a includes a semiconductor substrate 110a, an interconnection structure 120a disposed on the semiconductor substrate 110a, the conductive pillars or conductive vias 130, and a protection layer 140a. The protection layer 140a covers the interconnection structure 120a. The conductive pillars or conductive vias 130 are encapsulated by the protection layer 140a. During the wafer dicing process, the conductive pillars or conductive vias 130 are protected by the protection layer 140a from damage. As shown in FIG. 3, each integrated circuit 100a includes at least one antenna region A, the interconnection structure 120a of the integrated circuit 100a includes an inductor L (e.g., antenna wirings) embedded therein and a wiring-free dielectric portion B, the inductor L is covered by the wiring-free dielectric portion B of the interconnection structure 120a, and the antenna region A is corresponding to a pre-determined area where the inductor L (e.g., antenna wirings) is located.

Figure 4:
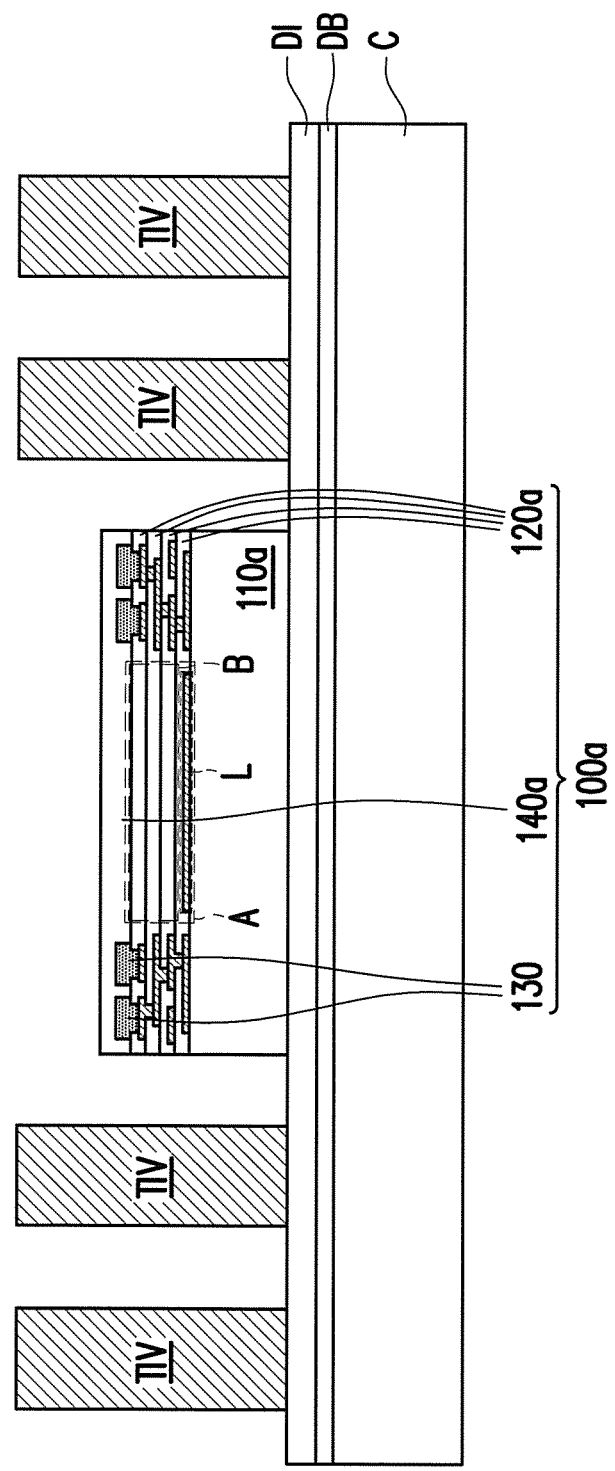

Referring to FIG. 4, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. After the carrier C having the de-bonding layer DB and the dielectric layer DI formed thereon is provided, a plurality of conductive through insulator vias TIV are formed on the dielectric layer DI. In some embodiments, the plurality of conductive through insulator vias TIV is formed by photoresist coating, photolithography, plating, and photoresist stripping process. For example, the conductive through insulator vias TIV include copper posts or other suitable metal posts.

As shown in FIG. 4, in some embodiments, one of the singulated integrated circuit 100a including the conductive vias 130 distributed thereon is picked and placed on the dielectric layer DI. The integrated circuit 100a is attached or adhered on the dielectric layer DI through a die attachment film (DAF), an adhesion paste or the like. In some alternative embodiments, two or more integrated circuits 100a are picked and placed on the dielectric layer DI, and the integrated circuits 100a placed on the dielectric layer DI may be arranged in an array. When the integrated circuits 100a placed on the dielectric layer DI are arranged in an array, the conductive through insulator vias TIV may be classified into groups, and each of the integrated circuits 100a is corresponding to and is surrounded by one group of the through insulator vias TIV, respectively. The number of the integrated circuits 100a is corresponding to the number of the groups of the conductive through insulator vias TIV.

As shown in FIG. 4, the integrated circuit 100a is picked and placed on the dielectric layer DI after the formation of the conductive through insulator vias TIV. However, the disclosure is not limited thereto. In some alternative embodiments, the integrated circuit 100a is picked and placed on the dielectric layer DI before the formation of the conductive through insulator vias TIV.

Figure 5:
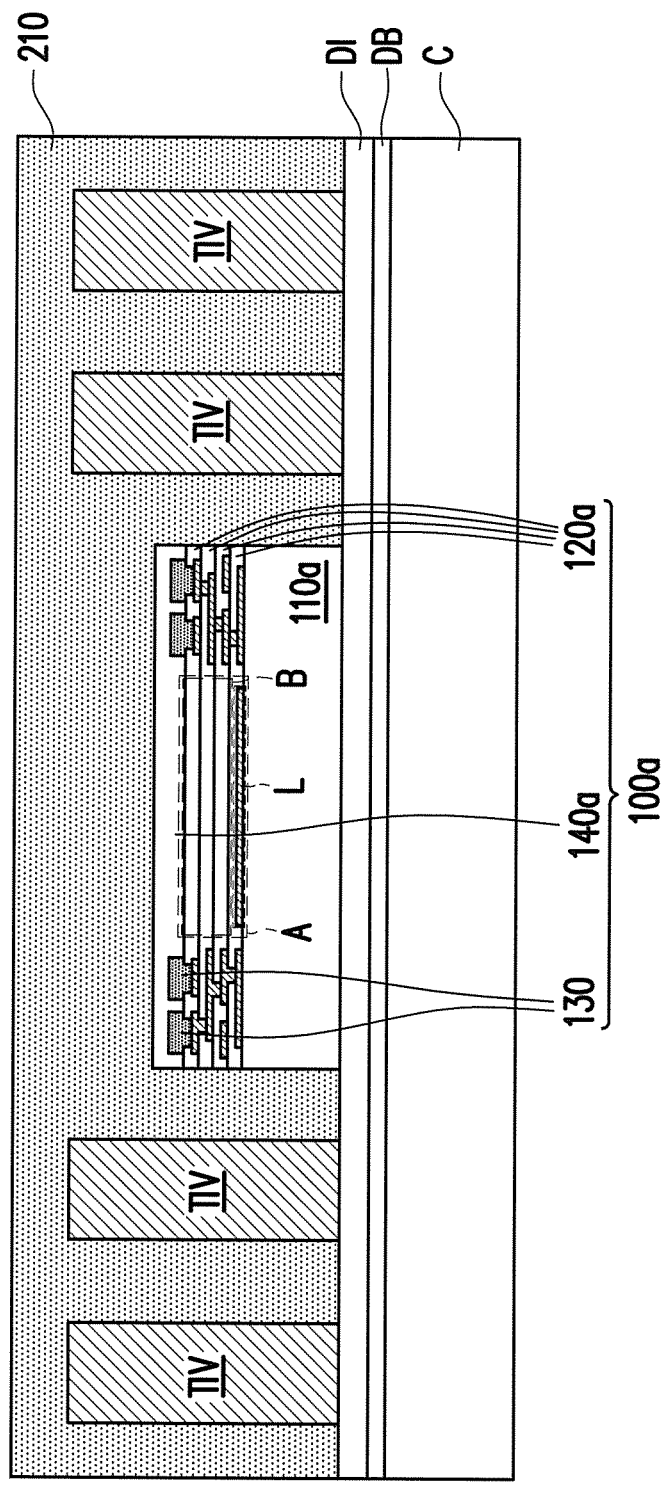

Referring to FIG. 5, an insulating material 210 is formed on the dielectric layer DI to cover the integrated circuit 100a and the conductive through insulator vias TIV. In some embodiments, the insulating material 210 is a molding compound formed by a molding process. The conductive vias 130 and the protection layer 140a of the integrated circuit 100a are covered by the insulating material 210. In other words, the conductive vias 130 and the protection layer 140a of the integrated circuit 100a are not revealed and are protected by the insulating material 210. In some embodiments, the insulating material 210 includes epoxy or other suitable dielectric materials.

Figure 6:
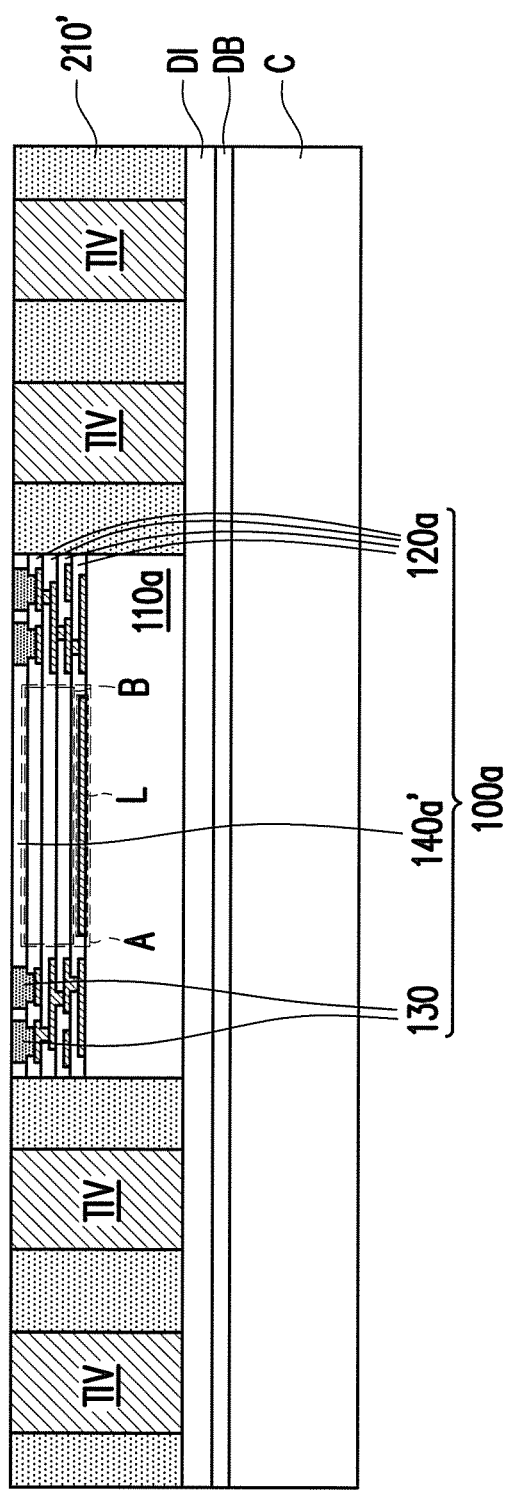

Referring to FIG. 6, the insulating material 210 is then grinded until the top surfaces of the conductive vias 130 and the top surface of the protection layer 140a are exposed. In some embodiments, the insulating material 210 is grinded by a mechanical grinding process and/or a chemical mechanical polishing (CMP) process. After the insulating material 210 is grinded, an insulating encapsulation 210' is formed over the dielectric layer DI. During the grinding process of the insulating material 210, parts of the conductive vias 130 and parts of the protection layer 140a are grinded until the top surfaces of the conductive vias 130 are exposed. After grinding process of the insulating material 210 is performed, a grinded protection layer 140a' are formed. In some embodiments, during the grinding process of the insulating material 210, parts of the conductive through insulator vias TIV are grinded also.

As shown in FIG. 6, the insulating encapsulation 210' encapsulates the sidewalls of the integrated circuit 100a, and the insulating encapsulation 210' is penetrated by the conductive through insulator vias TIV. In other words, the integrated circuit 100a and the conductive through insulator vias TIV are embedded in the insulating encapsulation 210'. It is noted that the top surfaces of the conductive through insulator vias TIV, the top surface of the insulating encapsulation 210', and the top surfaces of the conductive vias 130 are substantially coplanar with the top surface of the protection layer 140a'.

Figure 7:
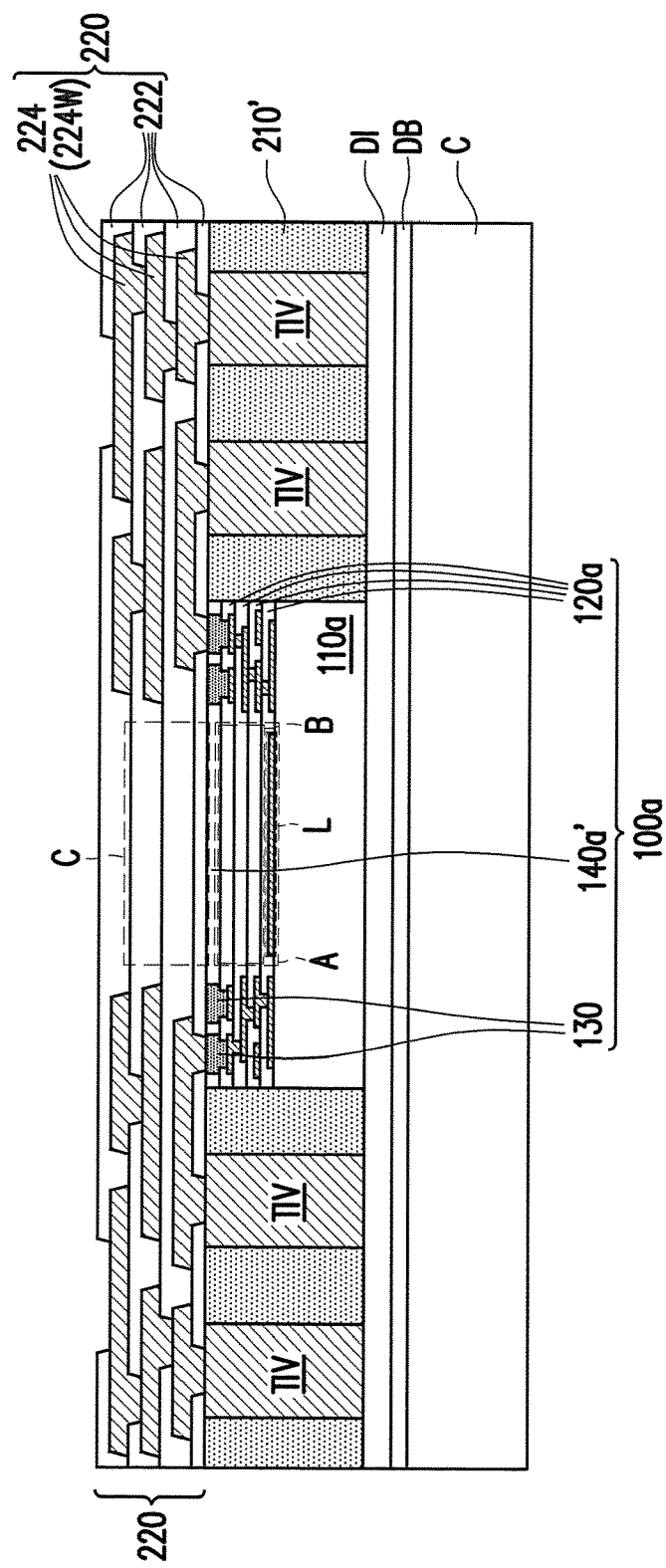

Referring to FIG. 7, after the insulating encapsulation 210' and the protection layer 140a' are formed, a redistribution circuit structure 220 electrically connected to the conductive vias 130 of the integrated circuit 100a is formed on the top surfaces of the conductive through insulator vias TIV, the top surface of the insulating encapsulation 210', the top surfaces of the conductive vias 130, and the top surface of the protection layer 140a'. The redistribution circuit structure 220 is described in accompany with FIG. 7 in detail.

As shown in FIG. 7, the redistribution circuit structure 220 includes a plurality of dielectric layers 222 and a plurality of redistribution conductive layers 224 stacked alternately, and the redistribution conductive layers 224 include a plurality of redistribution wirings 224W. The redistribution wirings 224W of the redistribution conductive layers 224 are electrically connected to the conductive vias 130 of the integrated circuit 100a and the conductive through insulator vias TIV embedded in the insulating encapsulation 210'. The redistribution circuit structure 220 includes a wiring-free dielectric portion C, and the wiring-free dielectric portion C entirely covers the antenna region A of the integrated circuit 110a. The wiring-free dielectric portion C of the redistribution circuit structure 220 entirely covers the antenna region A of the integrated circuit 110a and is located above the inductor L. In other words, the wiring-free dielectric portion B of the interconnection structure 120a is between the wiring-free dielectric portion C of the redistribution circuit structure 220 and the inductor L of the integrated circuit 110a. It is noted that there is no redistribution conductive layer distributed within the wiring-free dielectric portion C, and the redistribution conductive layers 224 are distributed outside the wiring-free dielectric portion C.

In some embodiments, the top surfaces of the conductive vias 130 and the top surfaces of the conductive through insulator vias TIV are in contact with the redistribution circuit structure 220. The top surfaces of the conductive vias 130 and the top surfaces of the conductive through insulator vias TIV are partially covered by the bottommost dielectric layer 222.

Figure 8:
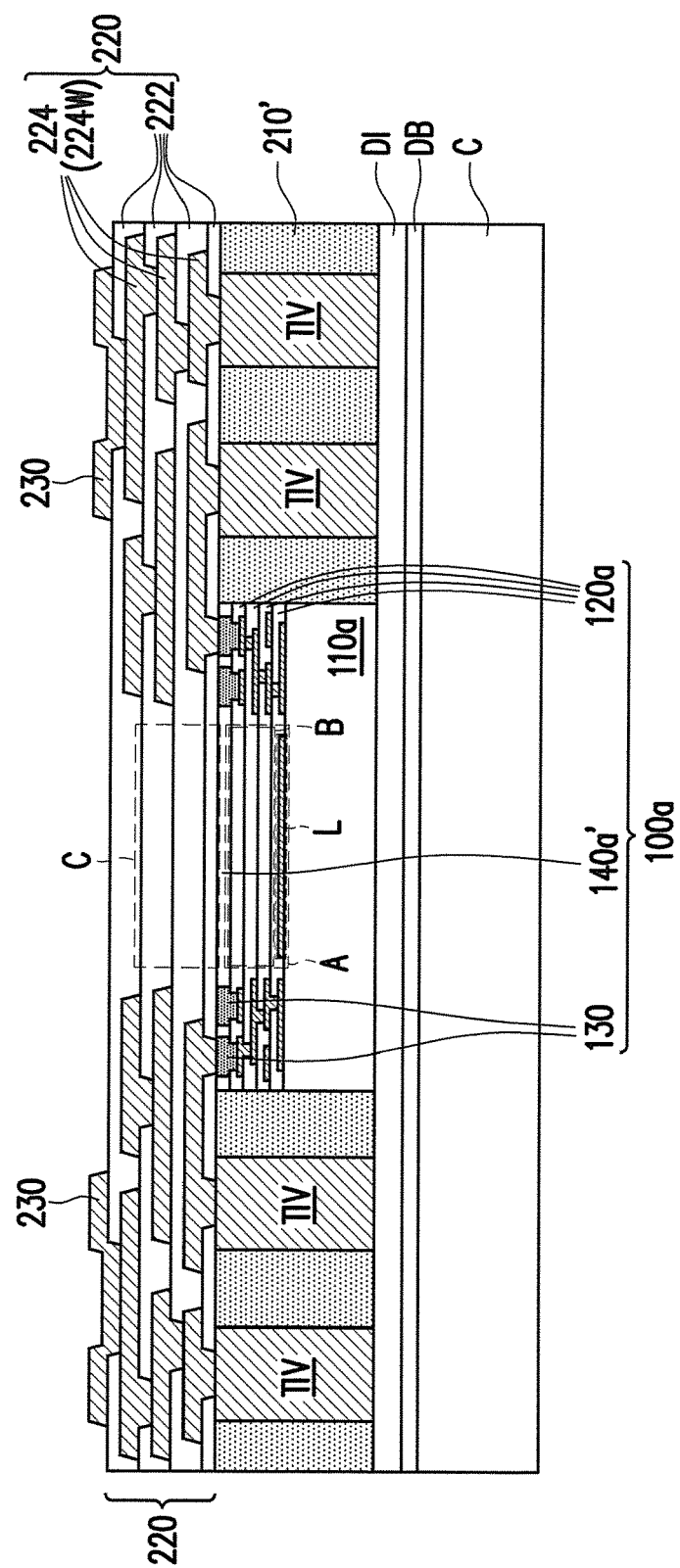

Referring to FIG. 8, after the redistribution circuit structure 220 is formed, a plurality of pads 230 are then formed on the topmost redistribution conductive layer 224 of the redistribution circuit structure 220. The pads 230 include a plurality of under-ball metallurgy (UBM) patterns for ball mount. The pads 230 are electrically connected to the topmost redistribution conductive layer 224 of the redistribution circuit structure 220. In other words, the pads 230 are electrically connected to the conductive vias 130 of the integrated circuit 100a and the conductive through insulator vias TIV through the redistribution circuit structure 220. It is noted that the number of the pads 230 is not limited in this disclosure. As shown in FIG. 8, there is no UBM pattern or pad distributed on the wiring-free dielectric portion C of the redistribution circuit structure 220.

Since an empty region including the wiring-free dielectric portion B of the interconnection structure 120a and the wiring-free dielectric portion C of the redistribution circuit structure 220 is formed above the inductor L, the signal performance (i.e. Q-factor) and reliability of the radio frequency integrated circuits (RF-ICs) 100a are enhanced. Furthermore, since there is no UBM pattern and the connection pad distributed above the empty region, the signal performance (i.e. Q-factor) and reliability of the radio frequency integrated circuits (RF-ICs) 100a are ensured.

Figure 9:
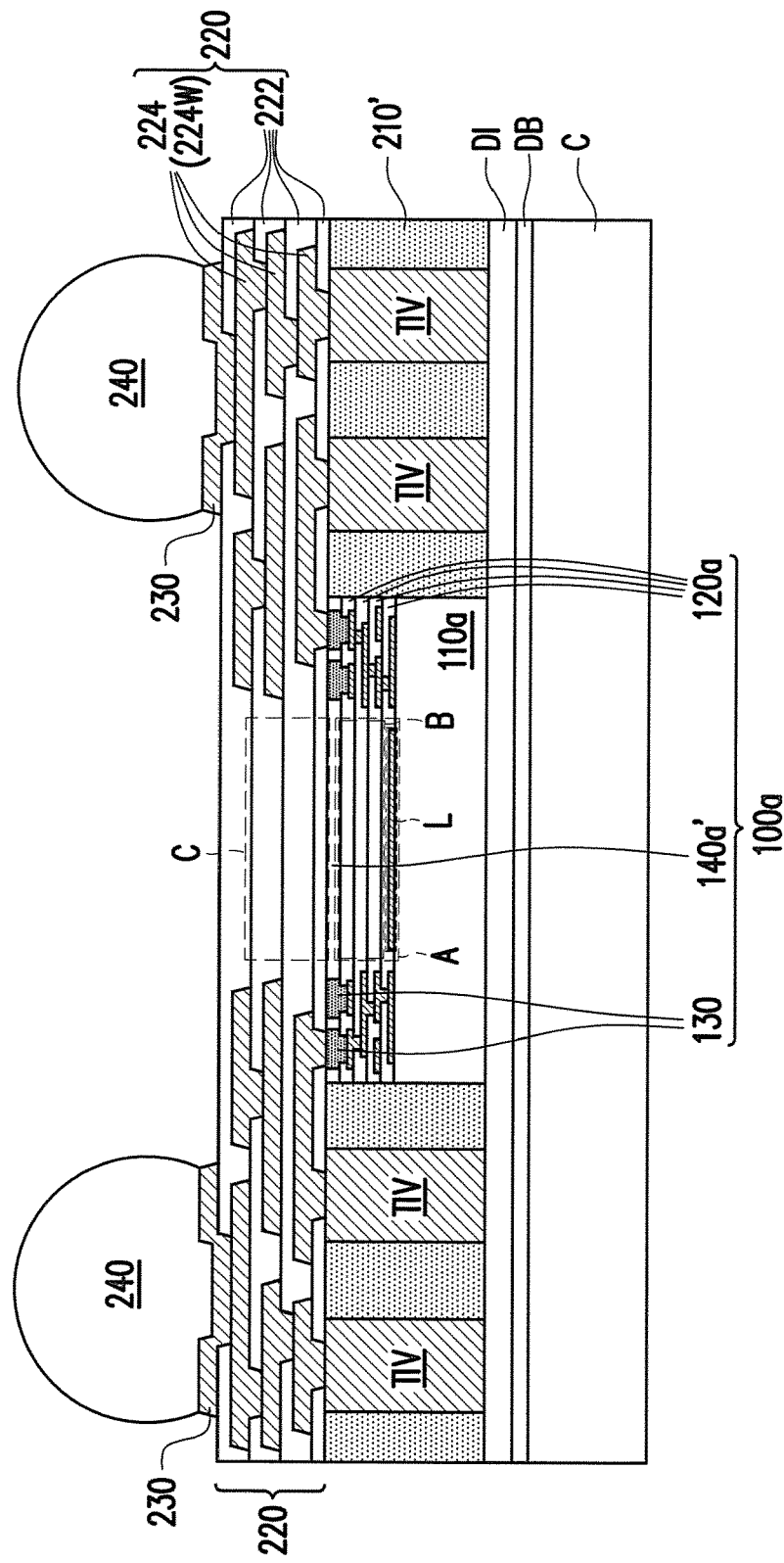

Referring to FIG. 9, after the pads 230 are formed, a plurality of conductive terminals are formed. In some embodiments, the conductive terminals include a plurality of conductive balls 240. The conductive balls 240 are placed on the pads 230. In some embodiments, the conductive balls 240 may be placed on the pads 230 by a ball placement process.

Figure 10:
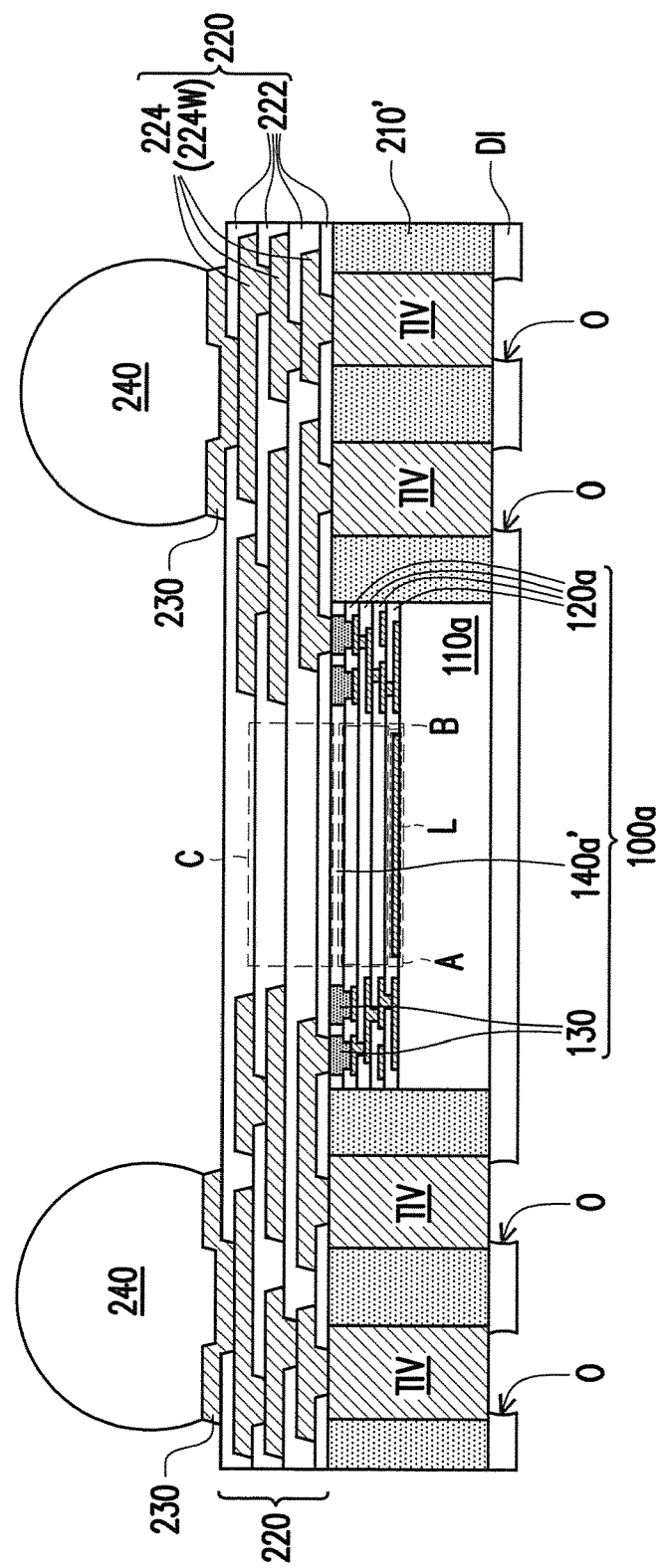

Referring to FIG. 9 and FIG. 10, after the conductive balls 240 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

As shown in FIG. 10, the dielectric layer DI is then patterned such that a plurality of contact openings O are formed to expose the bottom surfaces of the conductive through insulator vias TIV. The number and position of the contact openings O are corresponding to the number of the conductive through insulator vias TIV. In some embodiments, the contact openings O of the dielectric layer DI are formed by a laser drilling process or other suitable patterning processes.

Figure 11:
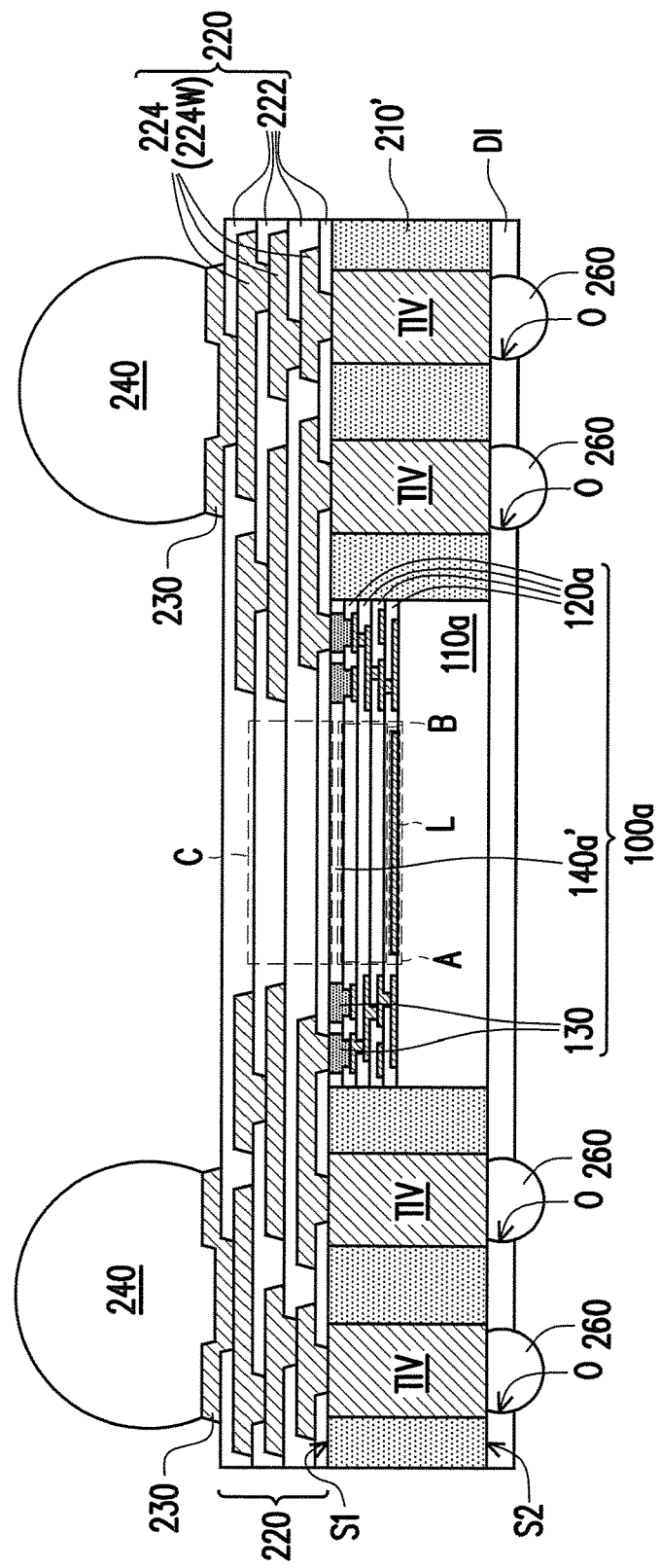

Referring to FIG. 11, after the contact openings O are formed in the dielectric layer DI, a plurality of conductive balls 260 are placed on the bottom surfaces of the conductive through insulator vias TIV that are exposed by the contact openings O. And, the conductive balls 260 are, for example, reflowed to bond with the bottom surfaces of the conductive through insulator vias TIV. As shown in FIG. 11, after the conductive balls 240 and the conductive balls 260 are formed, an integrated fan-out package of the integrated circuit 100 having dual-side terminal design (i.e. the conductive balls 240 and 260) is accomplished.

Figure 12:
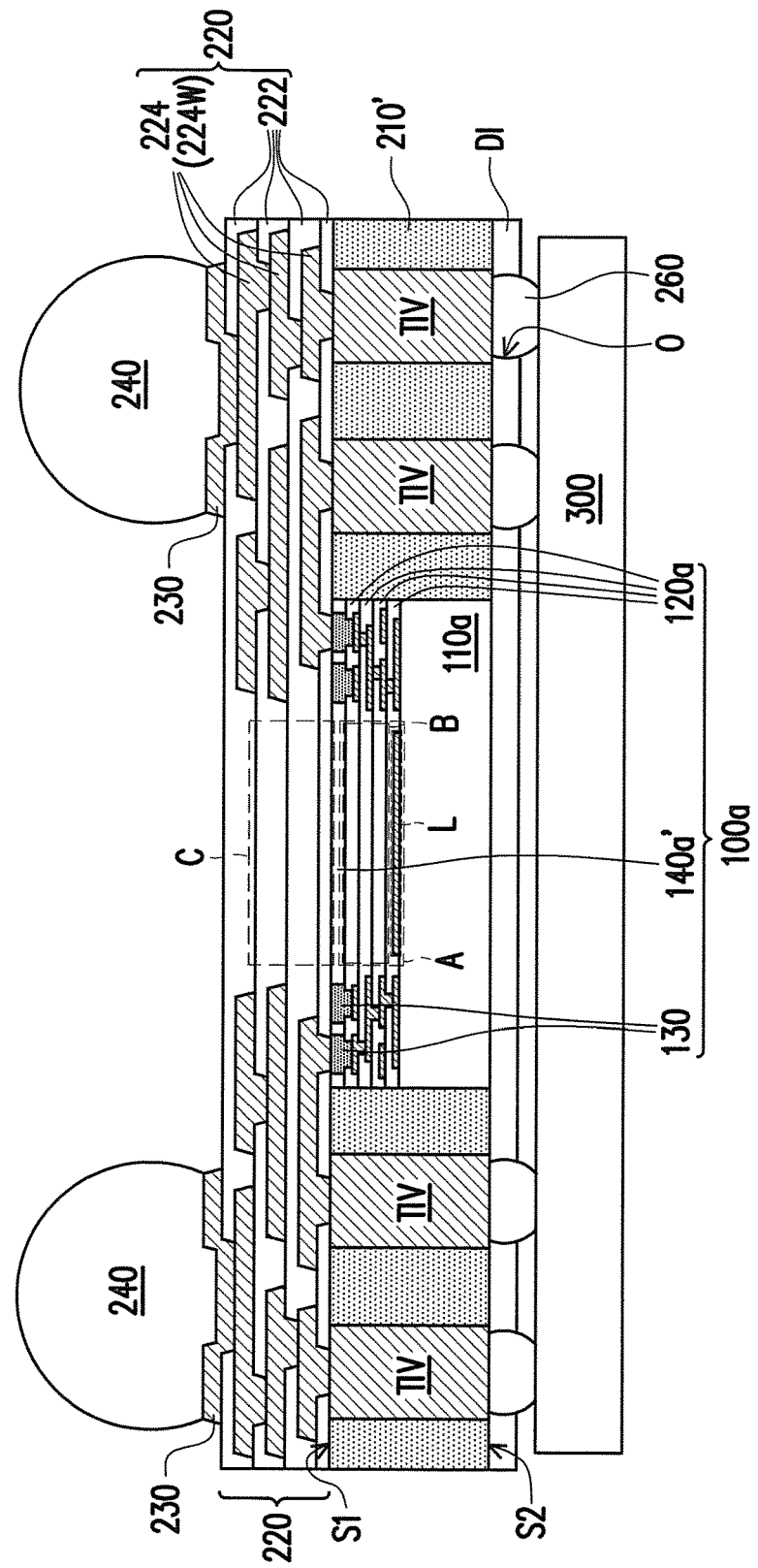
FIG. 12 is a cross-sectional view illustrating a package-on-package (POP) structure in accordance with some embodiments of the present disclosure.
Figure 13:
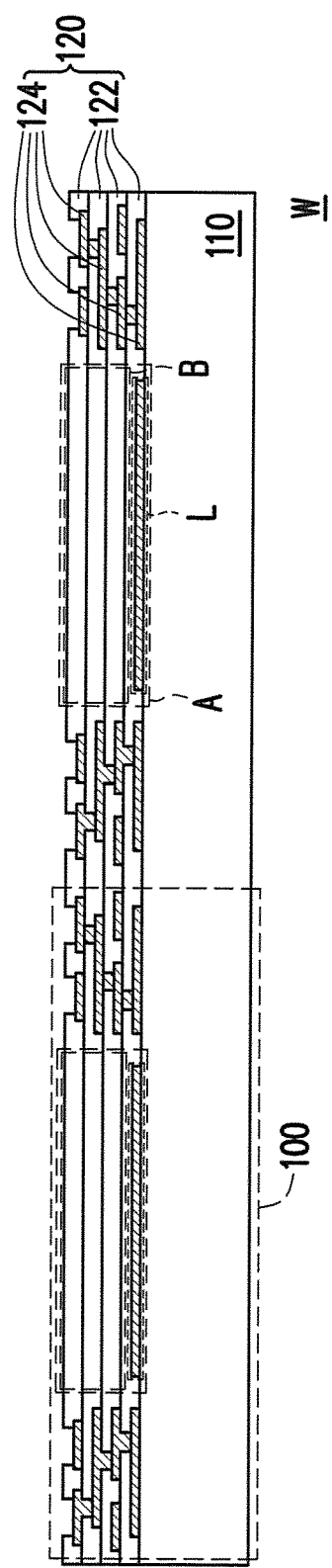
FIG. 13 through 23 schematically illustrate a process flow for fabricating an integrated fan-out package in accordance with some alternative embodiments of the present disclosure.
Figure 14:
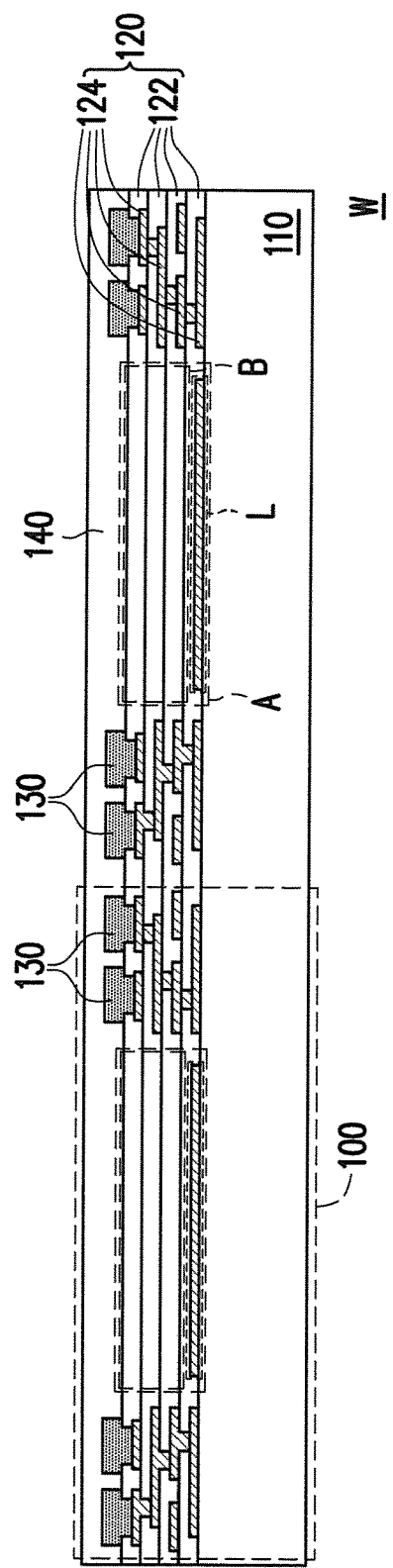
Figure 15:
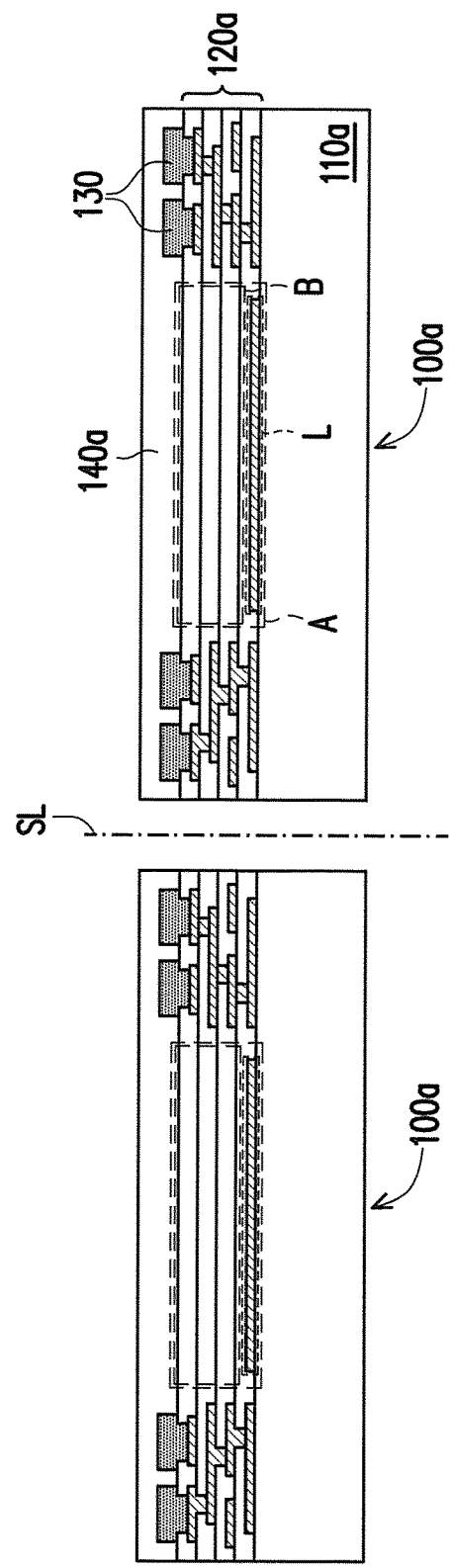
Figure 16:
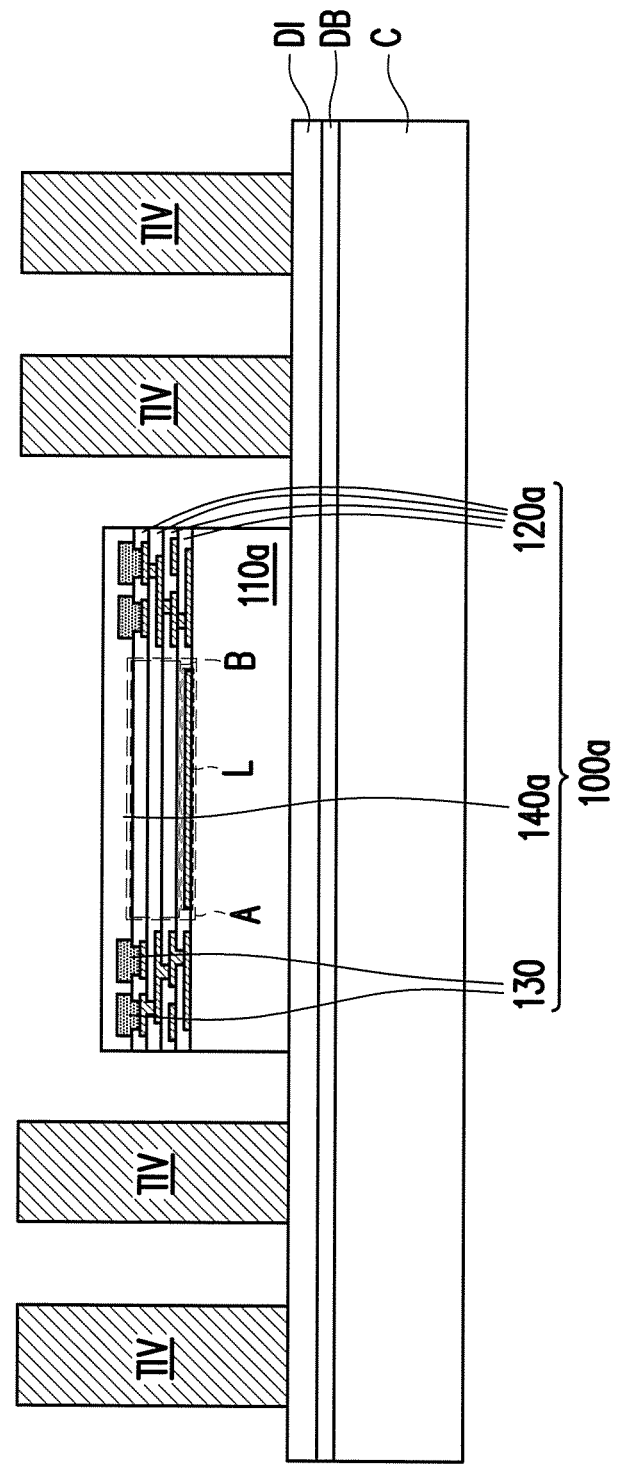
Figure 17:
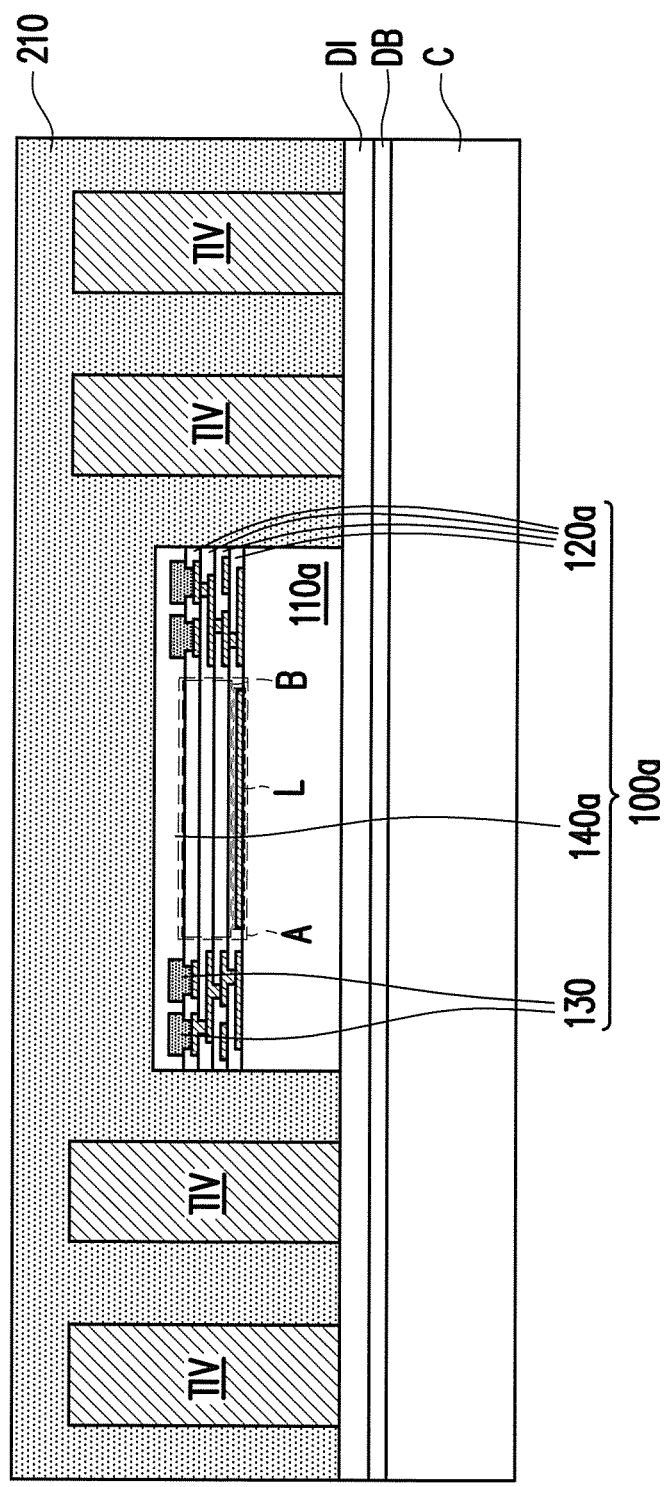
Figure 18:
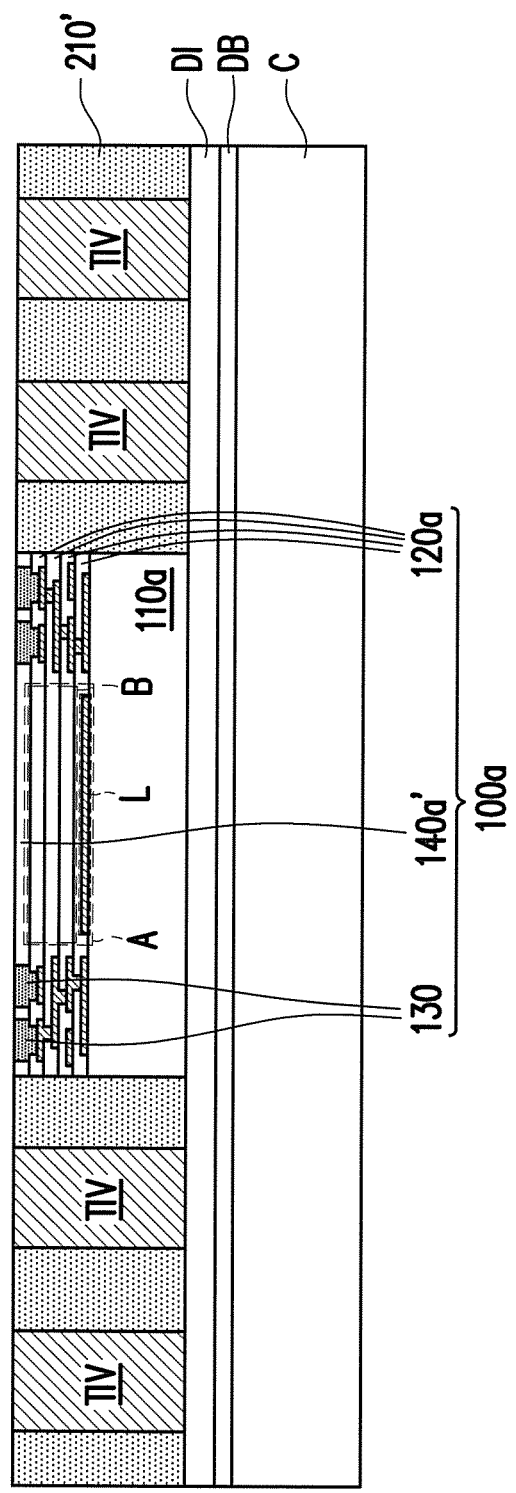

FIG. 12 is a cross-sectional view illustrating a package-on-package (POP) structure in accordance with some embodiments of the present disclosure. Referring to FIG. 12, another package 300 is then provided. The package 300 is, for example, a memory device or other suitable semiconductor devices. The package 300 is stacked over and is electrically connected to the integrated fan-out package illustrated in FIG. 11 through the conductive balls 260 such that a package-on-package (POP) structure is fabricated.

Figure 24:
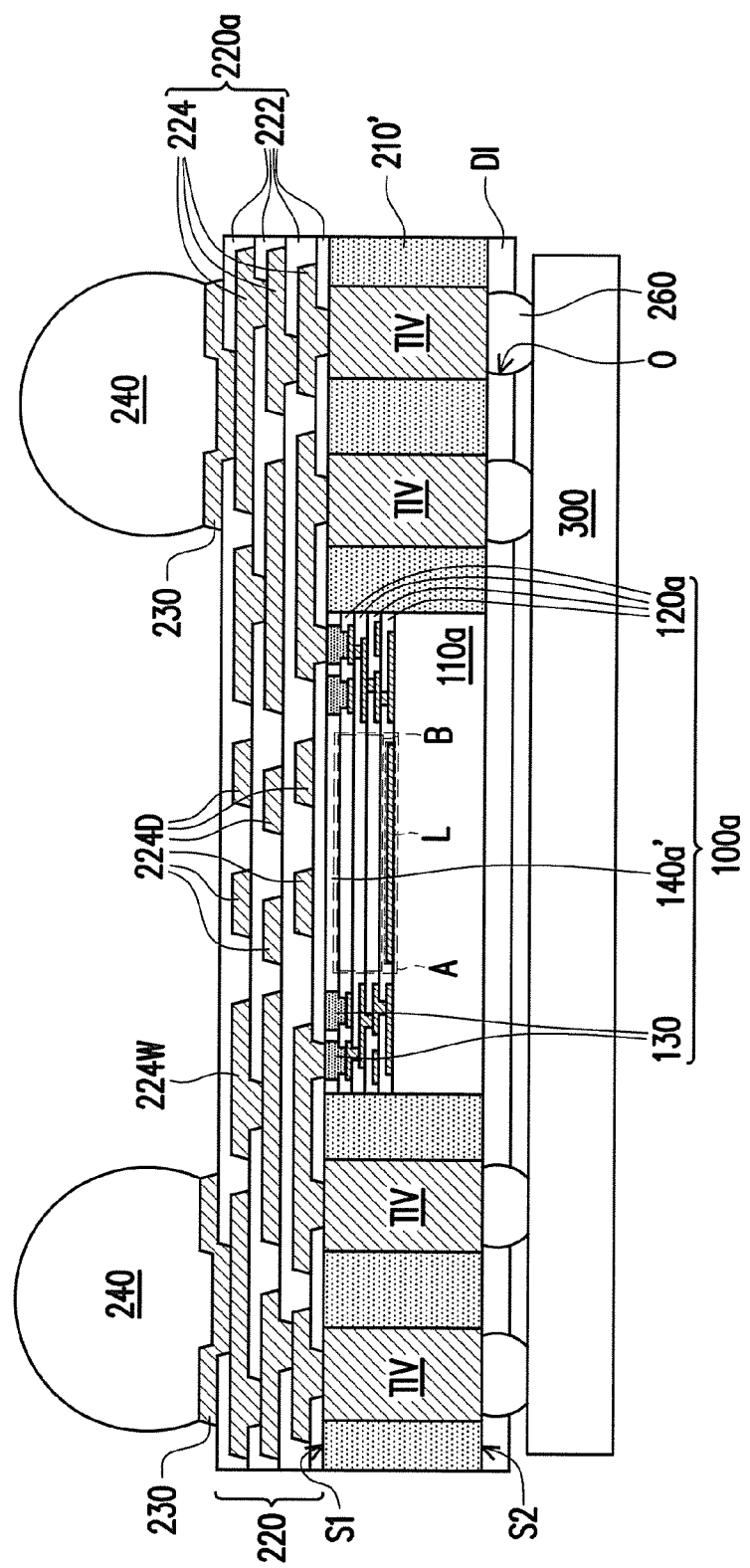
FIG. 24 is a cross-sectional view illustrating a package-on-package (POP) structure in accordance with some alternative embodiments of the present disclosure.

FIG. 13 through 23 schematically illustrate a process flow for fabricating an integrated fan-out package in accordance with some alternative embodiments of the present disclosure; and FIG. 24 is a cross-sectional view illustrating a package-on-package (POP) structure in accordance with some alternative embodiments of the present disclosure.

Referring to FIGS. 13 through 24, the process flow for fabricating an integrated fan-out package is similar with that illustrated in FIGS. 1 through 12 except for the fabrication of a redistribution circuit structure 220a. Since the process flow for fabricating an integrated fan-out package is similar with that illustrated in FIGS. 1 through 12, the detailed descriptions of FIGS. 13 through 18 and FIGS. 20 through 24 are thus omitted. The description regarding to the redistribution circuit structure 220a is described in accompany with FIG. 19.

Figure 19:
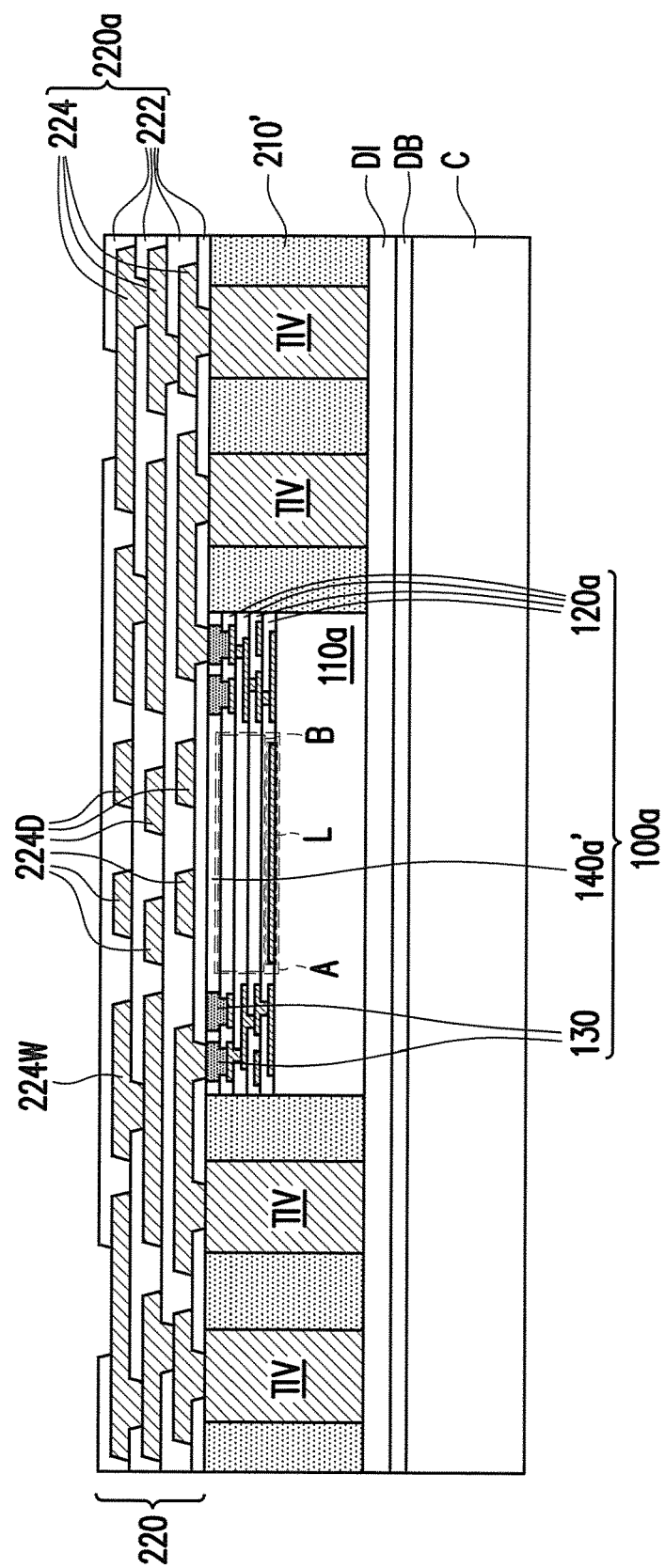
Figure 20:
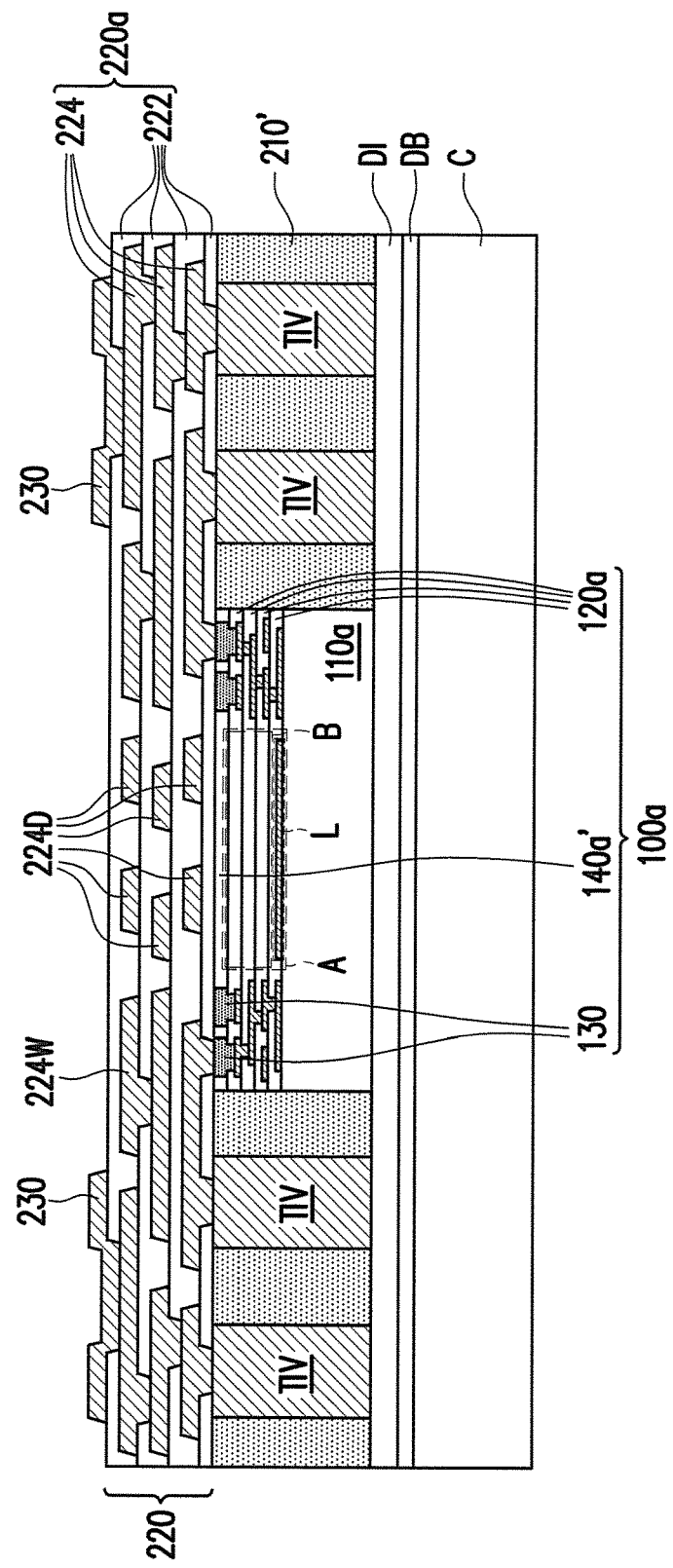
Figure 21:
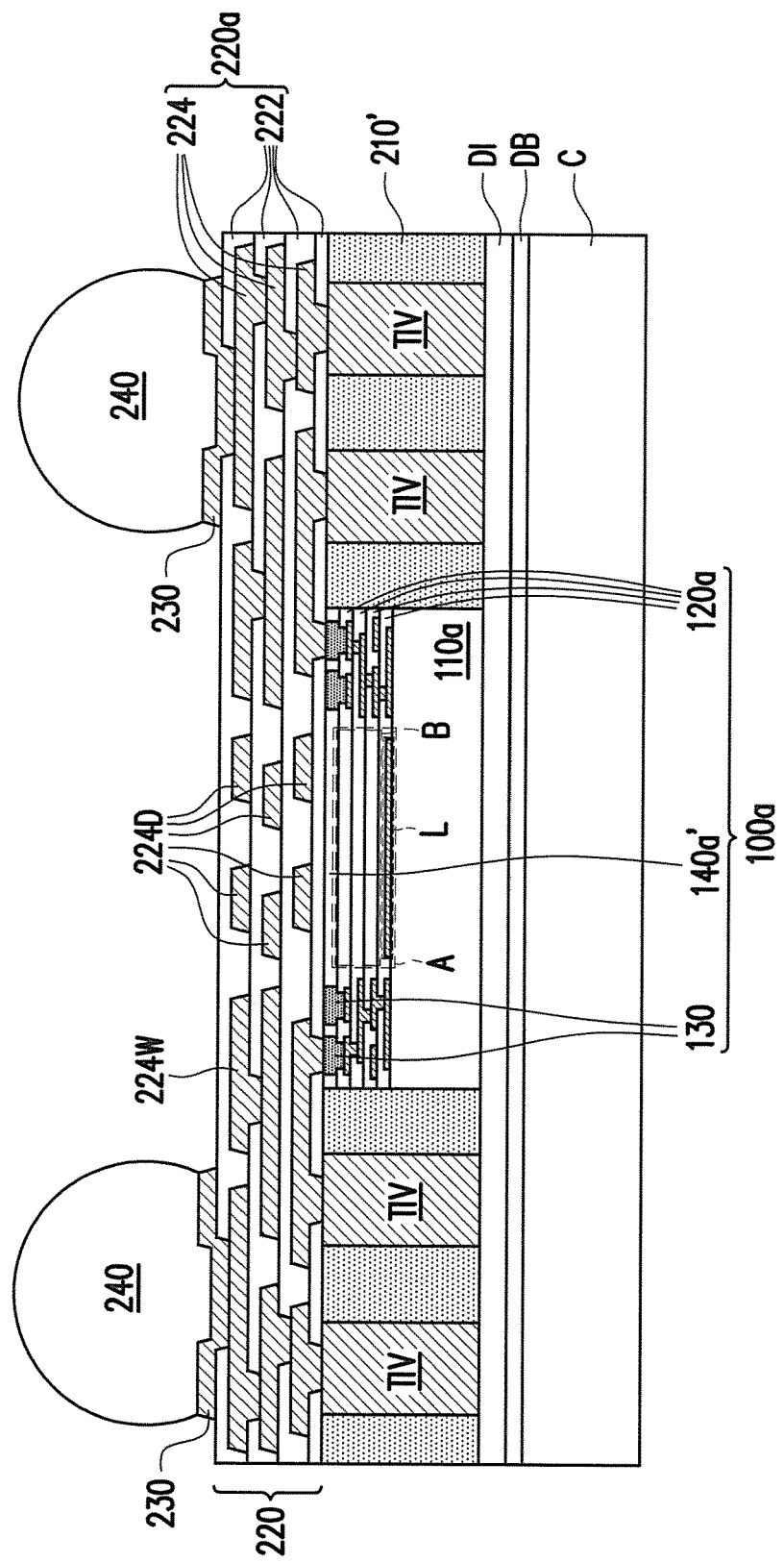
Figure 22:
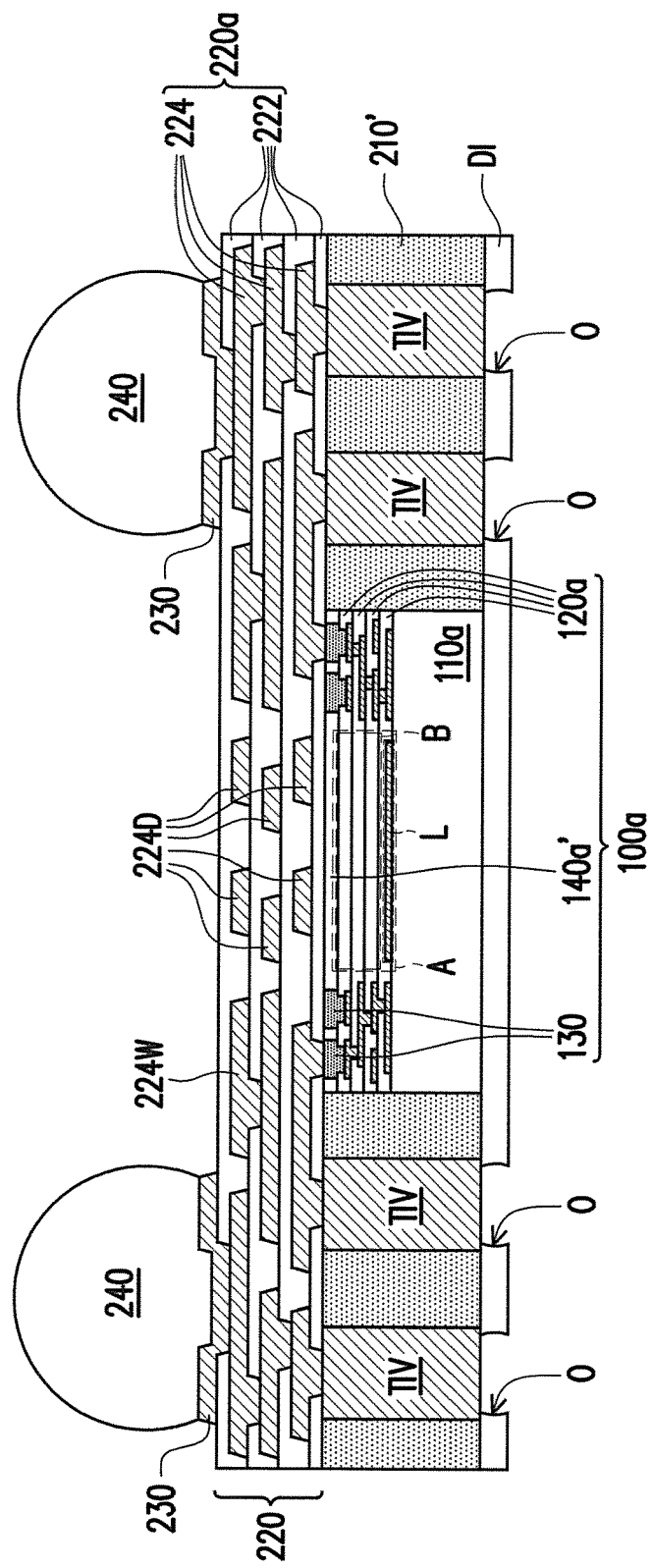
Figure 23:
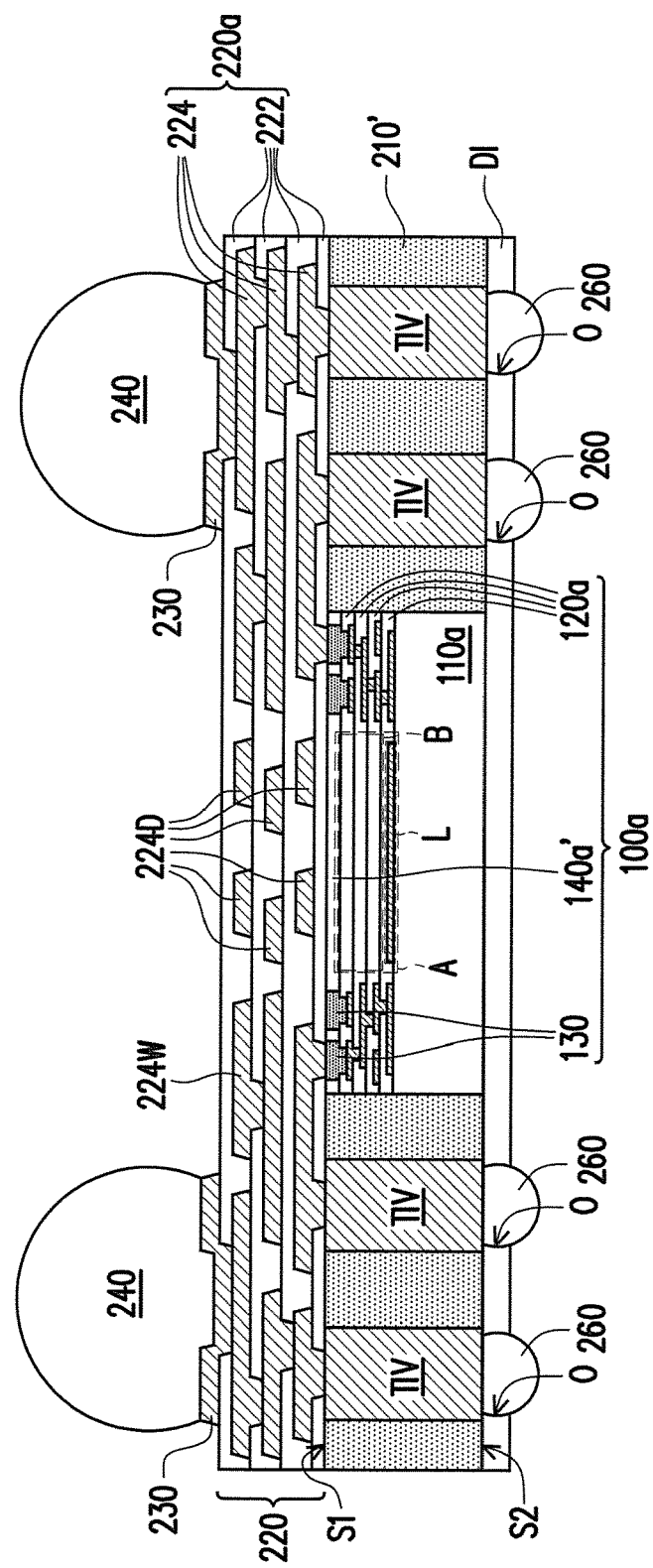

Referring to FIG. 19, after the insulating encapsulation 210' and the protection layer 140a' are formed, a redistribution circuit structure 220a electrically connected to the conductive vias 130 of the integrated circuit 100a is formed on the top surfaces of the conductive through insulator vias TIV, the top surface of the insulating encapsulation 210', the top surfaces of the conductive vias 130, and the top surface of the protection layer 140a'.

As shown in FIG. 19, the redistribution circuit structure 220a includes a plurality of dielectric layers 222 and a plurality of redistribution conductive layers 224 stacked alternately. The redistribution conductive layers 224 include a plurality of redistribution wirings 224W and a plurality of dummy patterns 224D located above the antenna region A. In other words, the dummy patterns 224D are located above the wiring-free dielectric portion B of the interconnection structure 120a, and the dummy patterns 224D of the redistribution conductive layers 224 are electrically floated. The signal performance (i.e. Q-factor) of the integrated circuit 110a is not significantly affected by the floated dummy patterns 224D. The redistribution wirings 224W of the redistribution conductive layers 224 are electrically connected to the conductive vias 130 of the integrated circuit 100a and the conductive through insulator vias TIV embedded in the insulating encapsulation 210'.

Figure 25:
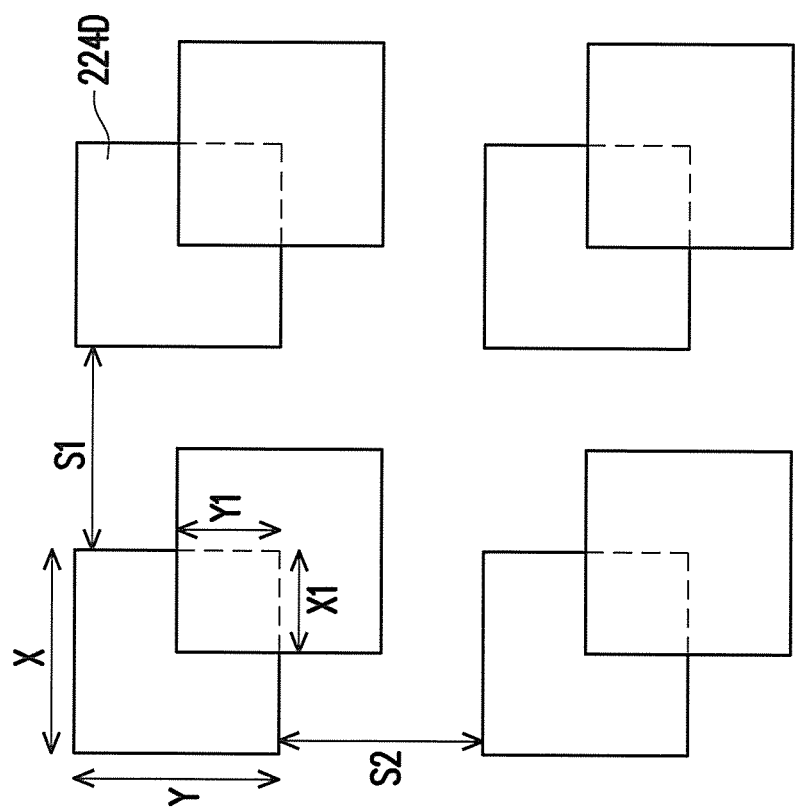
FIG. 25 is a top views illustrating the dummy patterns in accordance with some embodiments of the present disclosure.

FIG. 25 is a top views illustrating the dummy patterns in accordance with some embodiments of the present disclosure, and FIG. 26 is a top views illustrating the dummy patterns in accordance with some alternative embodiments of the present disclosure.

Referring to FIG. 19 and FIG. 25, the dummy patterns 224D are isolated patterns formed between the dielectric layers 222. In other words, the dummy patterns 224D are formed by different thin film processes and are arranged at different level heights. The dummy patterns 224D arranged at different level heights are spaced by the dielectric layers 222. For example, the dummy patterns 224D may include two or more stacked conductive layers.

In some embodiments, the dummy patterns 224D are of square shape, rectangular shape, polygon shape, circle shape, or other suitable shape. Taking the rectangular shaped dummy patterns 224D as an example, the side length X and the side length Y of the rectangular shaped dummy patterns 224D ranges from about 10 micrometers to about 50 micrometers, and the spacing S1 and S2 between the adjacent dummy patterns 224D arranged at the same level height ranges from about 10 micrometers to about 50 micrometers, for example. The dummy patterns 224D arranged at different level heights are overlapped along in the thickness direction of the redistribution circuit structure 220a, and the overlapping areas may be 10% to 90% of the area of the dummy patterns 224D, for example. Each overlapping area is of rectangular shape, and the side length X1 and the side length Y1 of the overlapping area ranges from about 5 micrometers to about 20 micrometers, for example. The overlapping areas are not limited to be of rectangular shape, the shaped of the overlapping areas may be square shape, polygon shape, circle shape, or other suitable shape.

Referring to FIG. 19 and FIG. 26, in some alternative embodiments, the dummy patterns 224D are, for example, a plurality of mesh patterns which are electrically insulated from one another.

The dummy patterns 224D are uniformly distributed above the antenna region A and capable of providing good topography of the redistribution circuit structure 220a. Furthermore, the signal performance (i.e. Q-factor) of the integrated circuit 110a is not significantly affected by the floated dummy patterns 224D.

In the above-mentioned embodiments as illustrated in FIGS. 1 to 24, the integrated fan-out packages for RF-ICs having good signal performance (i.e. Q-factor) and reliability are disclosed.

According to some embodiments, an integrated fan-out package including an integrated circuit, an insulating encapsulation, and a redistribution circuit structure is provided. The integrated circuit includes an antenna region. The insulating encapsulation encapsulates the integrated circuit. The redistribution circuit structure is disposed on the integrated circuit and the insulating encapsulation. The redistribution circuit structure is electrically connected to the integrated circuit, and the redistribution circuit structure includes a wiring-free dielectric portion covering the antenna region of the integrated circuit.

According to some alternative embodiments, an integrated fan-out package including an integrated circuit, an insulating encapsulation, and a redistribution circuit structure is provided. The integrated circuit includes an inductor embedded therein. The insulating encapsulation encapsulates the integrated circuit. The redistribution circuit structure is disposed on the integrated circuit and the insulating encapsulation, and the redistribution circuit structure is electrically connected to the integrated circuit. The redistribution circuit structure includes a first wiring-free dielectric portion located above the inductor.

According to some alternative embodiments, an integrated fan-out package including an integrated circuit, an insulating encapsulation, and a redistribution circuit structure is provided. The integrated circuit includes an antenna region. The insulating encapsulation encapsulates the integrated circuit. The redistribution circuit structure is disposed on the integrated circuit and the insulating encapsulation, and the redistribution circuit structure is electrically connected to the integrated circuit. The redistribution circuit structure includes a plurality of dielectric layers and a plurality of redistribution conductive layers stacked alternately. The redistribution conductive layers include a plurality of redistribution wirings and a plurality of dummy patterns located above the antenna region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
an integrated circuit comprising an antenna region;
an insulating encapsulation encapsulating the integrated circuit; and
a redistribution circuit structure disposed on the integrated circuit and the insulating encapsulation, the redistribution circuit structure being electrically connected to the integrated circuit, and the redistribution circuit structure comprising a first wiring-free dielectric portion, wherein the first wiring-free dielectric portion comprises a first dielectric stack, the first dielectric stack comprises a plurality of dielectric layers having no conductive layer distributed therein, the antenna region comprises an inductor and a second wiring-free dielectric portion, the second wiring-free dielectric portion is sandwiched between the inductor and the first wiring-free dielectric portion, and the first wiring-free dielectric portion abuts the second wiring-free dielectric portion.

2. The package as claimed in claim 1, wherein the antenna region is entirely covered by the first wiring-free dielectric portion.

3. The package as claimed in claim 1, wherein the redistribution circuit structure further comprises a second dielectric stack and a plurality of redistribution conductive layers, the second dielectric stack comprises a plurality of dielectric layers, and the plurality of dielectric layers of the second dielectric stack and the plurality of redistribution conductive layers are stacked alternately.

4. The package as claimed in claim 1 further comprising a plurality of through insulator vias embedded in the insulating encapsulation and electrically connected to the redistribution circuit structure.

5. The package as claimed in claim 1 further comprising:
a plurality of conductive terminals disposed on and electrically connected to the redistribution circuit structure.

6. An integrated fan-out package, comprising:
an integrated circuit comprising a semiconductor substrate and an interconnection structure covering the semiconductor substrate;
an insulating encapsulation encapsulating the integrated circuit; and
a redistribution circuit structure disposed on the integrated circuit and the insulating encapsulation, the redistribution circuit structure being electrically connected to the integrated circuit, and the redistribution circuit structure comprising a first wiring-free dielectric portion, wherein the first wiring-free dielectric portion comprises a first dielectric stack, the first dielectric stack comprises a plurality of first dielectric layers having no conductive layer distributed therein, the interconnection structure comprises an inductor and a second wiring-free dielectric portion, the second wiring-free dielectric portion comprises a plurality of second dielectric layers having no conductive layer distributed therein, the inductor is sandwiched between the second wiring-free dielectric portion and the semiconductor substrate, and the topmost second dielectric layer is directly in contact with the bottommost first dielectric layer.

7. The package as claimed in claim 6, wherein the inductor is entirely covered by the second wiring-free dielectric portion.

8. The package as claimed in claim 6, wherein the second wiring-free dielectric portion is entirely covered by the first wiring-free dielectric portion.

9. The package as claimed in claim 6, wherein the redistribution circuit structure further comprises a second dielectric stack and a plurality of redistribution conductive layers, the second dielectric stack comprises a plurality of third dielectric layers, and the plurality of third dielectric layers of the second dielectric stack and the plurality of redistribution conductive layers are stacked alternately.

10. The package as claimed in claim 6 further comprising:
a plurality of through insulator vias embedded in the insulating encapsulation and electrically connected to the redistribution circuit structure.

11. The package as claimed in claim 6 further comprising:
a plurality of conductive terminals disposed on and electrically connected to the redistribution circuit structure.

12. The package as claimed in claim 6, wherein the second wiring-free dielectric portion is sandwiched between the inductor and the first wiring-free dielectric portion.

13. An integrated fan-out package, comprising:
an integrated circuit comprising an inductor embedded therein;
an insulating encapsulation encapsulating the integrated circuit; and
a redistribution circuit structure disposed on the integrated circuit and the insulating encapsulation, wherein the redistribution circuit structure has a first surface and a second surface opposite to the first surface, the first surface faces the integrated circuit and the insulating encapsulation, a wiring-free region between the inductor and the second surface of the redistribution circuit structure along a direction perpendicular to the second surface is free of conductive layer, and the wiring-free region extends from a top surface of the inductor to the second surface of the redistribution structure.

14. The package as claimed in claim 13, wherein the wiring-free region comprises a first wiring-free dielectric portion and a second wiring-free dielectric portion, the first wiring-free dielectric portion is disposed over the second wiring-free dielectric portion, and the redistribution circuit structure comprises the first wiring-free dielectric portion.

15. The package as claimed in claim 14, wherein the second wiring-free dielectric portion is sandwiched between the inductor and the first wiring-free dielectric portion.

16. The package as claimed in claim 14, wherein the integrated circuit comprises a semiconductor substrate and an interconnection structure covering the semiconductor substrate, the interconnection structure comprises the inductor and the second wiring-free dielectric portion, and the inductor is covered by the second wiring-free dielectric portion.

17. The package as claimed in claim 16, wherein the inductor is entirely covered by the second wiring-free dielectric portion.

18. The package as claimed in claim 16, wherein the inductor is sandwiched between the second wiring-free dielectric portion and the semiconductor substrate.

19. The package as claimed in claim 13, further comprising a plurality of through insulator vias embedded in the insulating encapsulation and electrically connected to the redistribution circuit structure.

20. The package as claimed in claim 13 further comprising:
a plurality of conductive terminals disposed on and electrically connected to the redistribution circuit structure.

* * * * *